(12) United States Patent
Weng et al.

(10) Patent No.: US 11,004,733 B2
(45) Date of Patent: May 11, 2021

(54) PROTECTION STRUCTURES FOR BONDED WAFERS

(71) Applicant: Taiwan Semiconductor Manufacturing Company, Ltd., Hsinchu (TW)

(72) Inventors: Ssu-Chiang Weng, New Taipei (TW); Ping-Hao Lin, Tainan (TW); Fu-Cheng Chang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/399,066

(22) Filed: Apr. 30, 2019

(65) Prior Publication Data
US 2020/0006128 A1    Jan. 2, 2020

Related U.S. Application Data

(60) Provisional application No. 62/692,007, filed on Jun. 29, 2018.

(51) Int. Cl.
| H01L 21/768 | (2006.01) |
| H01L 23/522 | (2006.01) |
| H01L 23/528 | (2006.01) |
| H01L 25/065 | (2006.01) |
| H01L 23/31 | (2006.01) |

(Continued)

(52) U.S. Cl.
CPC .. *H01L 21/76832* (2013.01); *H01L 21/31116* (2013.01); *H01L 21/76805* (2013.01); *H01L 21/76807* (2013.01); *H01L 21/76831* (2013.01); *H01L 21/76877* (2013.01); *H01L 21/76897* (2013.01); *H01L 23/3171* (2013.01); *H01L 23/481* (2013.01); *H01L 23/5226* (2013.01);
(Continued)

(58) Field of Classification Search
CPC ........... H01L 21/76877; H01L 21/0657; H01L 21/76831
See application file for complete search history.

(56) References Cited

U.S. PATENT DOCUMENTS 9,525,001 B2    12/2016   Cheng et al.
9,633,917 B2     4/2017   Tsai et al.
(Continued)

FOREIGN PATENT DOCUMENTS

| CN | 105280610 A | 1/2016 |
| CN | 105742376 A | 7/2016 |

(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A method includes bonding a first wafer to a second wafer. The first wafer includes a plurality of dielectric layers, a metal pipe penetrating through the plurality of dielectric layers, and a dielectric region encircled by the metal pipe. The dielectric region has a plurality of steps formed of sidewalls and top surfaces of portions of the plurality of dielectric layers that are encircled by the metal pipe. The method further includes etching the first wafer to remove the dielectric region and to leave an opening encircled by the metal pipe, extending the opening into the second wafer to reveal a metal pad in the second wafer, and filling the opening with a conductive material to form a conductive plug in the opening.

19 Claims, 15 Drawing Sheets

(51) Int. Cl.
*H01L 23/48* (2006.01)
*H01L 21/311* (2006.01)

(52) U.S. Cl.
CPC ...... *H01L 23/5283* (2013.01); *H01L 25/0657* (2013.01)

(56) References Cited

U.S. PATENT DOCUMENTS

| | | |
|---|---|---|
| 2011/0097870 A1 | 4/2011 | La Tulipe, Jr. et al. |
| 2015/0348874 A1 | 12/2015 | Tsai et al. |
| 2015/0348917 A1* | 12/2015 | Tsai .................... H01L 25/0657 257/774 |
| 2017/0005000 A1 | 1/2017 | Beyne |

FOREIGN PATENT DOCUMENTS

| | | |
|---|---|---|
| KR | 20150137968 A | 12/2015 |
| KR | 20170022825 A | 3/2017 |
| TW | 201624615 A | 7/2016 |

\* cited by examiner

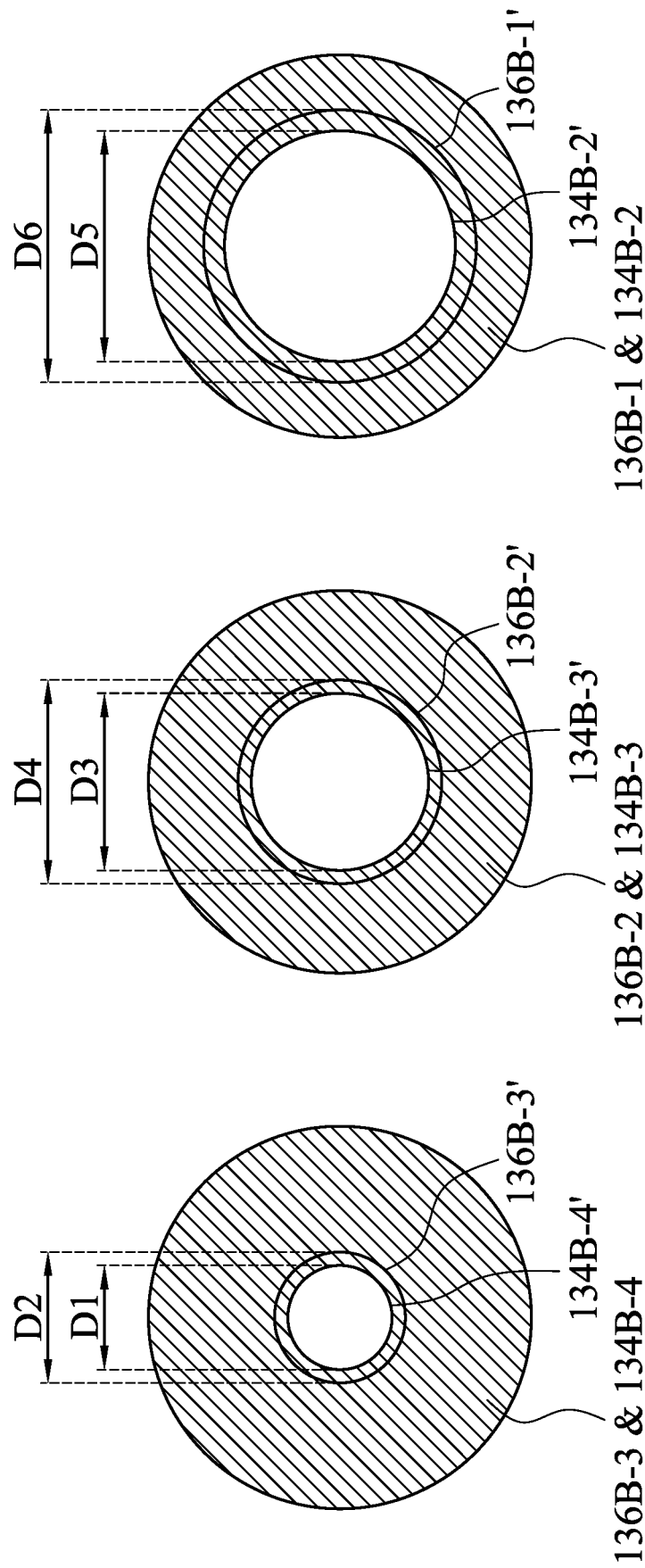

PROTECTION STRUCTURES FOR BONDED WAFERS

PRIORITY CLAIM AND CROSS-REFERENCE

This application claims the benefit of the following provisionally filed U.S. Patent application: Application Ser. No. 62/692,007, filed Jun. 29, 2018, and entitled "Protection Structures for Bonded Wafers;" which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrink the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. Once two semiconductor wafers are bonded together, the interface between two semiconductor wafers may provide an electrically conductive path between the stacked semiconductor wafers.

An advantageous feature of stacked semiconductor devices is that much higher density can be achieved by employing stacked semiconductor devices. Furthermore, stacked semiconductor devices can achieve smaller form factors, cost-effectiveness, improved performance, and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A, 13B, and 13C illustrate the bottom views of dual damascene structures in different layers of a metal pipe in accordance with some embodiments.

DETAILED DESCRIPTION

Figure 1:
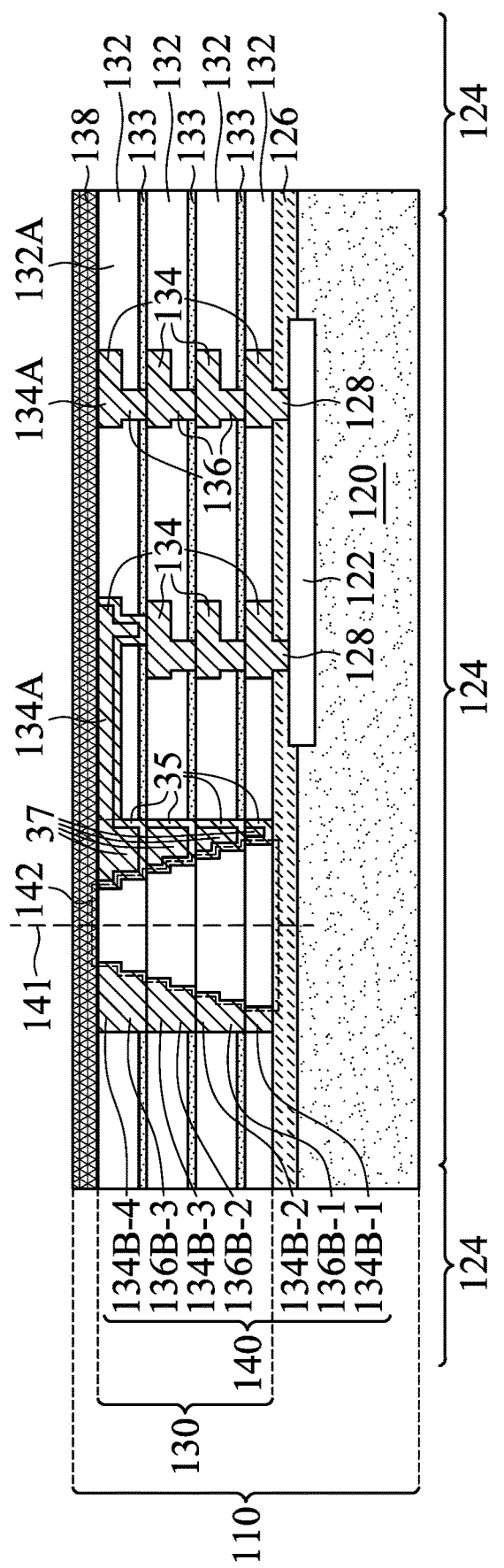
FIGS. 1 through 12 illustrate the cross-sectional views of intermediate stages in the formation of an interconnect structure connecting two dies in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure interconnecting two stacked dies and the method of forming the same are provided in accordance with various embodiments. The intermediate stages of forming the interconnect structure are illustrated in accordance with some embodiments. Some variations of some embodiments are discussed. Throughout the various views and illustrative embodiments, like reference numbers are used to designate like elements.

Figure 15:
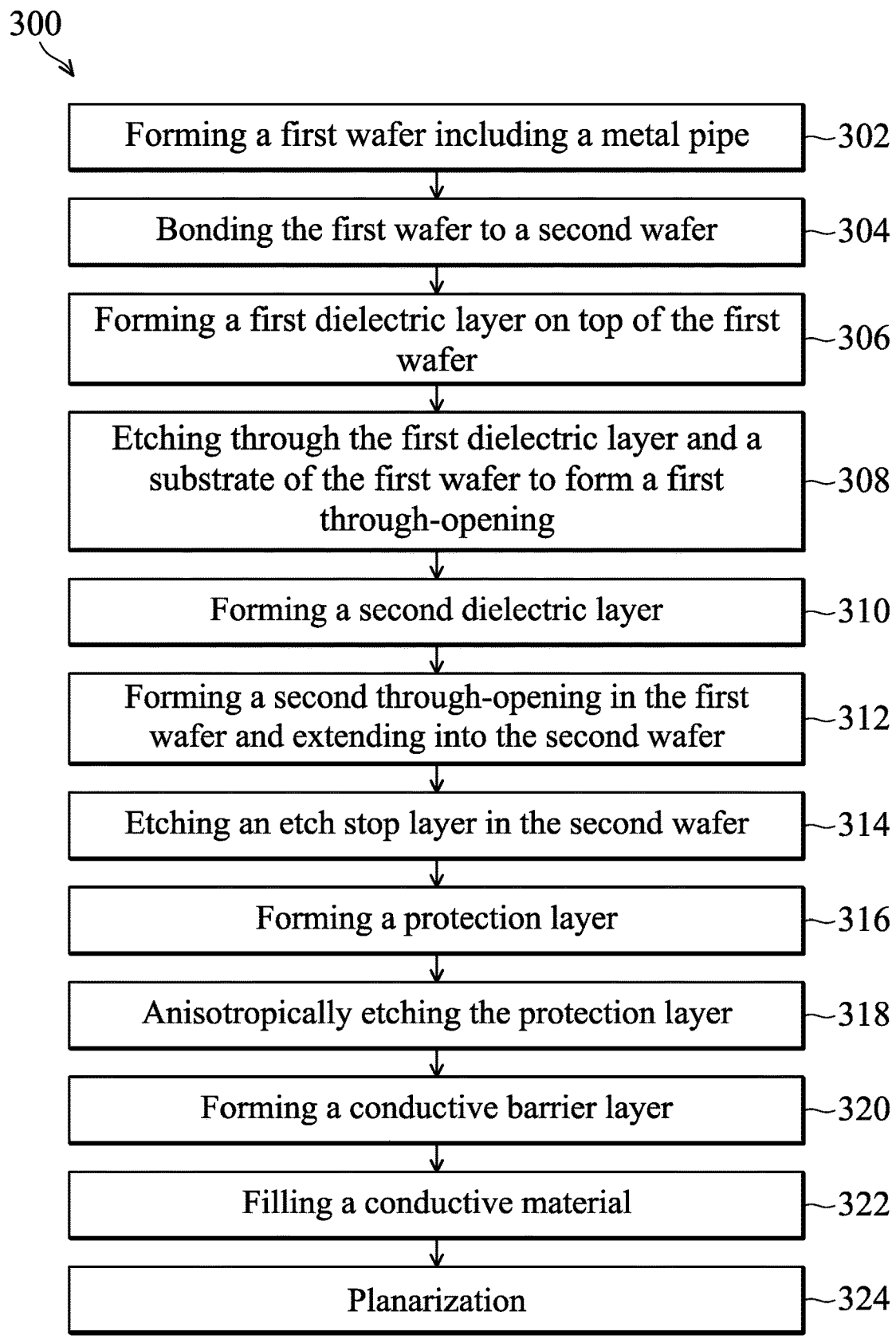
FIG. 15 illustrates a process flow for forming a stacked wafer/die structure in accordance with some embodiments.

FIGS. 1 through 12 illustrate the cross-sectional views of intermediate stages in the formation of stacked wafers (and the corresponding stacked dies) in accordance with some embodiments of the present disclosure. The steps shown in FIGS. 1 through 12 are also reflected schematically in the process flow 300 shown in FIG. 15.

FIG. 1 illustrates the cross-sectional view in the formation of wafer 110. The respective process is illustrated as process 302 in the process flow shown in FIG. 15. In accordance with some embodiments of the present disclosure, wafer 110 is a device wafer including active devices 122 such as transistors and/or diodes, and possibly passive devices such as capacitors, inductors, resistors, or the like. Wafer 110 may include a plurality of identical chips 124 therein, with one of chips 124 illustrated. Chips 124 are alternatively referred to as (device) dies hereinafter. The subsequent discussion of the wafers thus also applies to the corresponding device dies. In accordance with some embodiments of the present disclosure, wafer 110 is an image sensor wafer, which may further be a backside illuminated image sensor wafer, and active devices 122 may include image sensors, which may be photo diodes, for example. In accordance with some embodiments of the present disclosure, some of integrated circuit devices 122 are formed on the top surface of semiconductor substrate 120. The details of integrated circuit devices 122 are not illustrated herein. In accordance with alternative embodiments of the present disclosure, wafer 110 includes passive device dies and is free from active devices.

In accordance with some embodiments of the present disclosure, wafer 110 includes logic devices and circuits therein, which may include Application Specific Integrated Circuit (ASIC) circuits. In accordance with alternative embodiments of the present disclosure, wafer 110 is a logic wafer, which may include Central Processing Unit (CPU) dies, Micro Control Unit (MCU) dies, input-output (IO) dies, BaseBand (BB) dies, Application processor (AP) dies, or the like. Wafer 110 may also include memory dies such as Dynamic Random Access Memory (DRAM) dies or Static Random Access Memory (SRAM) dies.

In accordance with some embodiments of the present disclosure, wafer 110 includes semiconductor substrate 120 and the features (such as transistors) formed at a top surface of semiconductor substrate 120. Semiconductor substrate 120 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. Semiconductor substrate 120 may also be a bulk silicon substrate or a Semiconductor-On-Insulator (SOI) substrate. Shallow Trench Isolation (STI) regions (not shown) may be formed in semiconductor substrate 120 to isolate the active regions in semiconductor substrate 120. Although not shown, through-vias may be formed to extend into semiconductor substrate 120, and the through-vias are used to electrically intercouple the features on opposite sides of wafer 110.

Inter-Layer Dielectric (ILD) 126 is formed over semiconductor substrate 120, and fills the space between the gate stacks of transistors (not shown) in integrated circuit devices 122. In accordance with some embodiments of the present disclosure, ILD 126 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like. ILD 126 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like. Although not shown, a Contact Etch Stop Layer (CESL) may be formed between ILD 126 and integrated circuit devices 122, with contact plugs 128 penetrating through the CESL.

Contact plugs 128 are formed in ILD 126, and are used to electrically connect integrated circuit devices 122 to overlying metal lines 134 and vias 136. In accordance with some embodiments of the present disclosure, contact plugs 128 are formed of a conductive material selected from tungsten, aluminum, copper, titanium, tantalum, titanium nitride, tantalum nitride, alloys therefore, and/or multi-layers thereof. The formation of contact plugs 128 may include forming contact openings in ILD 126 (and the underlying CESL), filling a conductive material(s) into the contact openings, and performing a planarization process (such as a Chemical Mechanical Polish (CMP) process) to level the top surfaces of contact plugs 128 with the top surface of ILD 126.

Over ILD 126 and contact plugs 128 resides interconnect structure 130. Interconnect structure 130 includes dielectric layers 132, and metal lines 134 and vias 136 formed in dielectric layers 132. Dielectric layers 132 are sometimes referred to as Inter-Metal Dielectric (IMD) layers 132 hereinafter. In accordance with some embodiments of the present disclosure, some of the lower dielectric layers 132 are formed of a low-k dielectric material having a dielectric constant (k-value) lower than about 3.0 or about 2.5. Dielectric layers 132 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 132 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 132 includes depositing a porogen-containing dielectric material, and then performing a curing process to drive out the porogen, and hence the remaining dielectric layers 132 become porous. Etch stop layers 133, which may be formed of silicon carbide, silicon nitride, or the like, are formed between IMD layers 132.

Metal lines 134 and vias 136 are formed in dielectric layers 132 and etch stop layers 133. The metal lines 134 at a same level are collectively referred to as a metal layer hereinafter. In accordance with some embodiments of the present disclosure, interconnect structure 130 includes a plurality of metal layers that are interconnected through vias 136. Metal lines 134 and vias 136 may be formed of copper or copper alloys, and can also be formed of other metals. The formation process may include single damascene and dual damascene processes. In a single damascene process, a trench is first formed in one of dielectric layers 132, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into both the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like.

Metal lines 134 include metal lines 134A, which are sometimes referred to as top metal lines. Top metal lines 134A are also collectively referred to as being a top metal layer. The respective dielectric layer 132A may be formed of a non-low-k dielectric material such as Un-doped Silicate Glass (USG), silicon oxide, silicon nitride, or the like. Dielectric layer 132A may also be formed of a low-k dielectric material, which may be selected from the similar materials of the underlying IMD layers 132.

In accordance with some embodiments of the present disclosure, passivation layer 138 is formed over the top metal layer. Passivation layer 138 is a surface dielectric layer of wafer 110. Passivation layer 138 is formed of a non-low-k dielectric material, which has the function of blocking moisture and detrimental chemicals from reaching devices 122 and interconnect structure 130. Furthermore, passivation layer 138 may be formed of a material that can be used for fusion bonding, and may include silicon oxide. In accordance with some embodiments of the present disclosure, no etch stop layer is formed between top metal layer 134 and passivation layer 138. Accordingly, the bottom surface of passivation layer 138 is in direct contact with the top surfaces of metal lines 134A. Passivation layer 138 may be formed of a homogenous material, with all portions of the passivation layer 138 formed of the same material such as silicon oxide.

Wafer 110 (die 124) includes a plurality of metal pipes 140, with one metal pipe 140 illustrated. Metal pipes 140 may be formed of metals and metal alloys such as copper, titanium, aluminum, aluminum copper (AlCu), tantalum, tungsten, or the like. In accordance with some embodiments, each of metal pipes 140 includes a diffusion barrier and a metallic material on the diffusion barrier. The diffusion barrier may be formed of titanium, tantalum, titanium nitride, tantalum nitride, or the like. The metallic material may be copper, aluminum, or the like. FIG. 1 schematically illustrates diffusion barrier layers 35 and the metallic material in some of the metal pipes 140, while other metal pipes and metal lines and vias may have similar structures. Metal pipe 140 includes a plurality of metal-line portions 134B-1, 134B-2, 134B-3, and 134B-4, as shown in the illustrated example, with each being in one of the metal-line layers. That is, the metal-line portion (such as 134B-1, 134B-2, 134B-3, 134B-4) and one of the metal lines 134 are in the same level. Metal pipe 140 further includes a plurality of via portions 136B-1, 136B-2, and 136B-3 as shown in the illustrated example, with each being in one of the metal-via layers. That is, the via portion (such as 136B-1, 136B-2, 136B-3) and one of the vias 136 are in the same level. The metal-line portions 134B-1, 134B-2, 134B-3, and 134B-4 and the via portions 136B-1, 136B-2, and 136B-3 are alternately arranged. It is appreciated that wafer 110 may include more or fewer metal layers and via layers than illustrated. Accordingly, the total number of the via portions and metal line portions in a metal pipe 140 will vary correspondingly. Metal pipe 140 is formed in the same processes as the formation of the metal lines 134 and vias 136 in the same metal layer. Each of the metal-line portions 134B-1, 134B-2, 134B-3, and 134B-4 and each of the via portions 136B-1, 136B-2, and 136B-3 may be a solid ring. The resulting metal pipe 140 is also a solid metal pipe. Metal pipe 140 is electrically coupled to active devices 122 through some metal lines 134 and vias 136, as illustrated in accordance with some embodiments.

Metal pipe 140 encircle dielectric region 142 therein, and dielectric region 142 includes the portions of dielectric layers 132 encircled by metal pipe 140. In accordance with some embodiments of the present disclosure, dielectric region 142 has gradually increased lateral dimensions, which may be diameters, from the top of dielectric region 142 to the bottom of dielectric region 142. For example, in the illustrated embodiments, each of the dielectric portions encircled by a corresponding via portion of metal pipe 140 has a greater lateral dimension than the dielectric portion encircled by the corresponding overlying metal-line portion of metal pipe 140. Each of the dielectric portion encircled by the corresponding metal-line portion of metal pipe 140 also has a greater lateral dimension than the dielectric portion encircled by the corresponding overlying via portion. Accordingly, the sidewalls and top surfaces of dielectric region 142 form a plurality of steps. Alternatively stated, in each of the dual damascene structures of metal pipe 140, the inner sidewalls of the via portion of metal pipe 140 are recessed relative to the inner sidewalls of the respective overlying metal-line portion. The inner sidewalls of the via portions and metal-line portions are the sidewalls contacting the sidewalls of dielectric region 142.

In accordance with alternative embodiments of the present disclosure, in each (or some but not all) of the dual damascene structures of metal pipe 14o, the inner sidewalls of the via portion 136B-1/136B-2/136B-3 of metal pipe 140 are flush with the inner sidewalls of the respective overlying metal-line portion 134B-2/134B-3/134B-4. Alternatively stated, each of the via portions of metal pipe 140 may have an inner sidewall flush with the inner sidewall of the overlying metal line portion in the same dual damascene structure. For example, via portion 136B-1 and metal-line portion 134B-2 are in the same dual damascene structure, and may have inner sidewalls flush with each other. Via portion 136B-2 and metal-line portion 134B-3 are in the same dual damascene structure, and may have inner sidewalls flush with each other. Via portion 136B-3 and metal-line portion 134B-4 are in the same dual damascene structure, and may have inner sidewalls flush with each other. Accordingly, the corresponding dielectric region 142 has fewer steps than illustrated since no step is formed inside some dual damascene structures. Rather, the steps are formed between dual damascene structures.

In accordance with some embodiments of the present disclosure, the outer sidewall of metal pipe 140 is substantially straight and vertical. This means that the outer sidewalls of the via portions and metal-line portions of metal pipe 140 are flush with each other. In accordance with some embodiments of the present disclosure, the outer sidewalls of the via portions and metal-line portions of metal pipe 140 are not flush with each other. For example, when metal-line portions 134B-1, 134B-2, 134B-3, and 134B-4 and via portions 136B-1, 136B-2, and 136B-3 have a same thickness (measured in a horizontal direction), the outer sidewalls of lower ones of the via portions and metal-line portions are farther away from the center line 141 of metal pipe 140 than outer sidewalls of the corresponding upper ones of the via portions and metal-line portions. Alternatively stated, the outer sidewalls of the via portions and metal line portions of metal pipe 140 also form a plurality of steps.

FIG. 13A illustrates the bottom view of a first dual damascene structure formed of via portion 136B-3 and metal line portion 134B-4 (FIG. 1) having inner sidewalls 136B-3' and 134B-4', respectively. The diameters of inner sidewalls 134B-4' and 136B-3' are D1 and D2, respectively, with diameter D2 being greater than (or equal to) diameter D1. FIG. 13B illustrates the bottom view of a second dual damascene structure formed of via portion 136B-2 and metal line portion 134B-3 (FIG. 1) having inner sidewalls 136B-2' and 134B-3', respectively. The diameters of inner sidewalls 134B-3' and 136B-2' are D3 and D4, respectively, with diameter D4 being greater than (or equal to) diameter D3, which is further greater than D2. FIG. 13C illustrates the bottom view of a third dual damascene structure formed of via portion 136B-1 and metal-line portion 134B-2 (FIG. 1), which have inner sidewalls 136B-1' and 134B-2', respectively. The diameters of inner sidewalls 134B-2' and 136B-1' are D5 and D6, respectively, with diameter D6 being greater than (or equal to) D5, which is further greater than diameter D4. Metal-line portion 134B-1 (FIG. 1) may have a similar bottom-view shape as metal-line portion 134B-2 (FIG. 13C), with the diameter of the inner sidewall being greater than D6.

Throughout the description, dimensions D1 through D7 are referred to as inner lateral dimensions of metal pipe 140. In accordance with some embodiments of the present disclosure, as illustrated in FIGS. 13A, 13B, and 13C, the relationship may exist that $D7 > D6 \geq D5 > D4 \geq D3 > D2 \geq D1$.

Figure 14B:
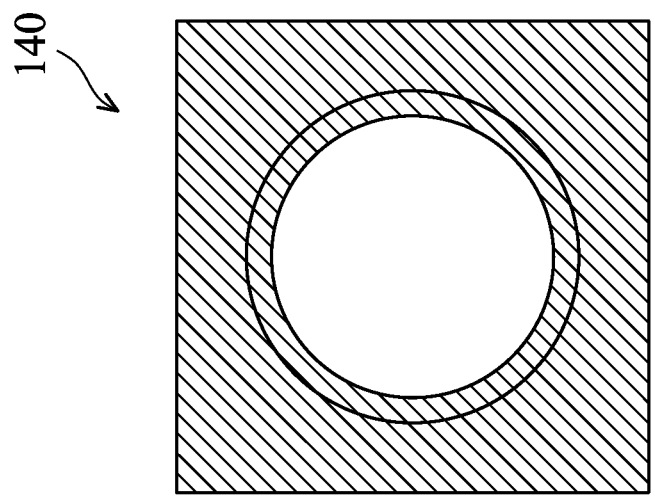
FIGS. 14A and 14B illustrate the bottom views of some dual damascene structures in a metal pipe in accordance with some embodiments.
Figure 14A:
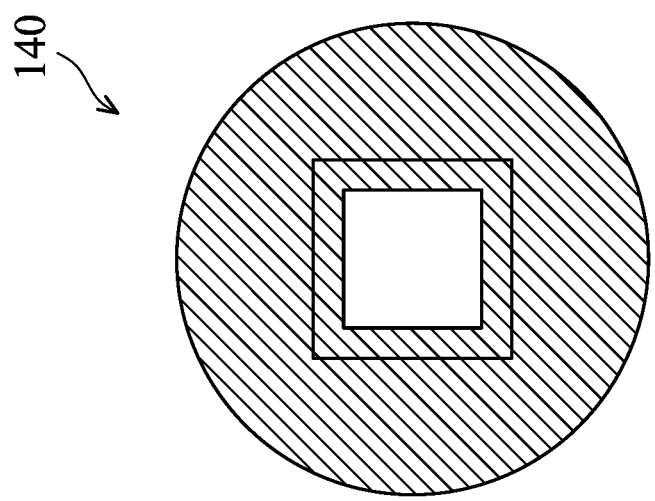

In the examples as shown in FIGS. 13A, 13B, and 13C, the inner sidewalls and outer sidewalls of the dual damascene structures have circular bottom-view shapes. It is appreciated that the bottom views of the inner sidewalls and the outer sidewalls of the dual damascene structures (and single-damascene structures) may adopt shapes other than circles, which may include, and not limited to, squares, hexagons, rectangles, ellipse, or the like. For example, FIG. 14A illustrates a metal portion in metal pipe 140 having an inner sidewall having a bottom-view shape of a square, and an outer sidewall having a bottom-view shape of a circle. FIG. 14B illustrates a metal portion having inner sidewalls having a bottom-view shape of a circle, and an outer sidewall having a bottom-view shape of a square.

Figure 2:
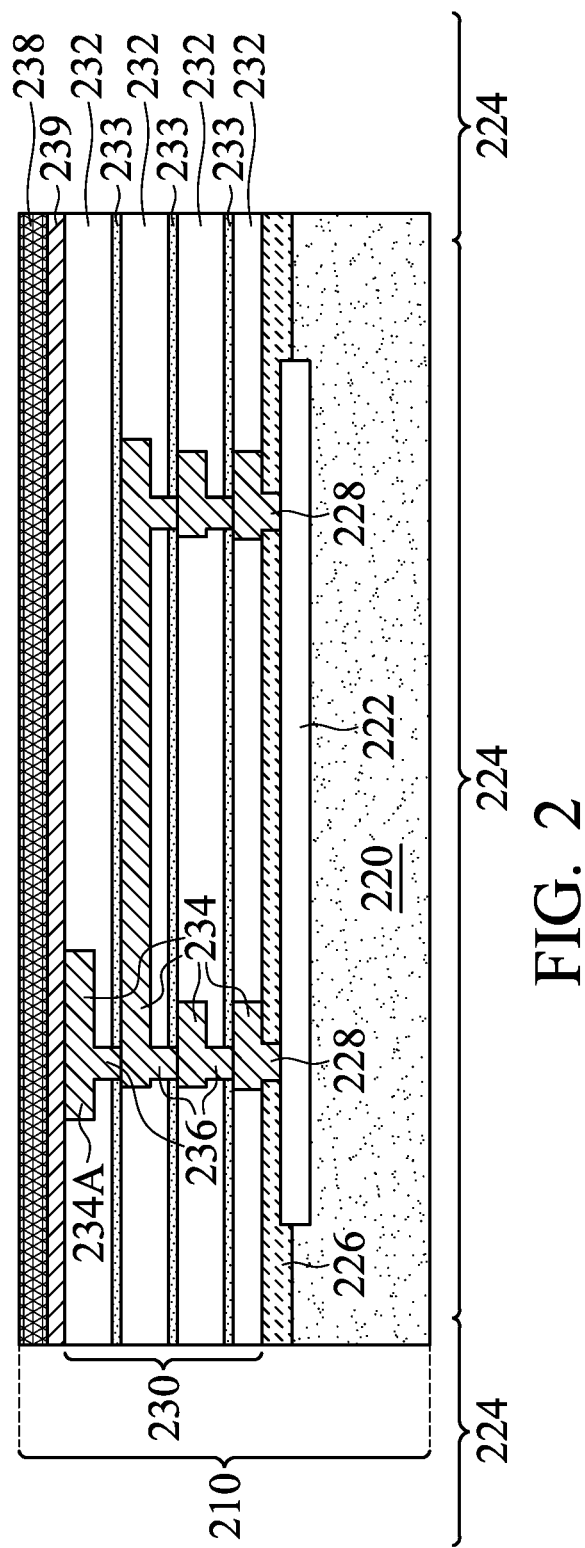

FIG. 2 illustrates the cross-sectional view in the formation of wafer 210. In accordance with some embodiments of the present disclosure, wafer 210 is a device wafer including active devices 222 such as transistors and/or diodes, and possibly passive devices such as capacitors, inductors, resistors, or the like. Wafer 210 may include a plurality of identical chips/dies 224 therein, with the details of one of chips 224 illustrated. In accordance with some embodiments of the present disclosure, device die 224 is a logic die, which may be an ASIC die including ASIC circuits therein. In accordance with some embodiments of the present disclosure, device die 224 is a logic die, which may be a CPU die, a MCU die, an IO die, a BB die, an AP die, or the like. Device die 224 may also be a memory die such as a DRAM die or a SRAM die. In accordance with alternative embodiments of the present disclosure, wafer 210 includes passive devices (with no active devices therein).

In accordance with some embodiments of the present disclosure, wafer 210 includes semiconductor substrate 220 and the features (such as transistors) formed at a top surface of semiconductor substrate 220. Semiconductor substrate 220 may be formed of a material selected from the same group of candidate materials for forming semiconductor substrate 120 (FIG. 1), and may have a structure selected from the same group of candidate structures of semiconductor substrate 120. Although not shown, through-vias may be formed to extend into semiconductor substrate 220, and the through-vias are used to electrically inter-couple the features on opposite sides of wafer 210.

ILD 226 is formed over semiconductor substrate 220, and fills the space between the gate stacks of transistors (not shown) in integrated circuit devices 222. In accordance with some embodiments of the present disclosure, ILD 226 is formed of a material selected from the same group of candidate materials of ILD 126 (FIG. 1). ILD 226 may also be formed using spin coating, FCVD, CVD, PECVD, LPCVD, or the like.

Contact plugs 228 are formed in ILD 226. Over ILD 226 and contact plugs 228 resides interconnect structure 230. Interconnect structure 230 includes dielectric layers 232, and metal lines 234 and vias 236 formed in dielectric layers 232. Dielectric layers 232 are alternatively referred to as IMD layers 232 hereinafter. Etch stop layers 233 may also be formed. In accordance with some embodiments of the present disclosure, some of dielectric layers 232 are formed of a low-k dielectric material(s) having a dielectric constant (k-value) lower than about 3.0 or about 2.5. In accordance with alternative embodiments of the present disclosure, some or all of dielectric layers 232 are formed of non-low-k dielectric materials such as silicon oxide, silicon carbide, silicon carbo-nitride, silicon oxy-carbo-nitride, or the like.

Metal lines 234 and vias 236 are formed in dielectric layers 232 and etch stop layers 233. In accordance with some embodiments of the present disclosure, interconnect structure 230 includes a plurality of metal layers that are interconnected through vias 236. Metal lines 234 and vias 236 may be formed of copper or copper alloys, and can also be formed of other metals. The formation process may include single damascene and dual damascene processes. Metal lines 234 include metal lines 234A, which are sometimes referred to as top metal lines. One of the top metal lines is illustrated, and is referred to as metal pad 234A hereinafter. The other metal lines in the same layer as metal pad 234A are not illustrated, and may also exist. The respective dielectric layer 232A may be formed of a non-low-k dielectric material such as USG, silicon oxide, silicon nitride, or the like, or may be formed of a low-k dielectric material.

In accordance with some embodiments of the present disclosure, passivation layer 238 is formed over the top metal layer. Passivation layer 238 is a surface dielectric layer of wafer 210. Passivation layer 238 may be formed of a non-low-k dielectric material, which has the function of blocking moisture and detrimental chemicals from reaching the devices 222 and interconnect structure 230. Furthermore, passivation layer 238 may be formed of a material that can be used for fusion bonding, and may include silicon oxide. In accordance with some embodiments of the present disclosure, etch stop layer 239 is formed between top metal layer 234 and passivation layer 238. Etch stop layer 239 is formed of a material different from the material of passivation layer 238. The material of etch stop layer 239 may be selected from copper oxide, hafnium oxide, aluminum oxide, tungsten oxide, silicon nitride, silicon carbide, silicon oxynitride, silicon oxy-carbo-nitride, or the like.

Figure 3:
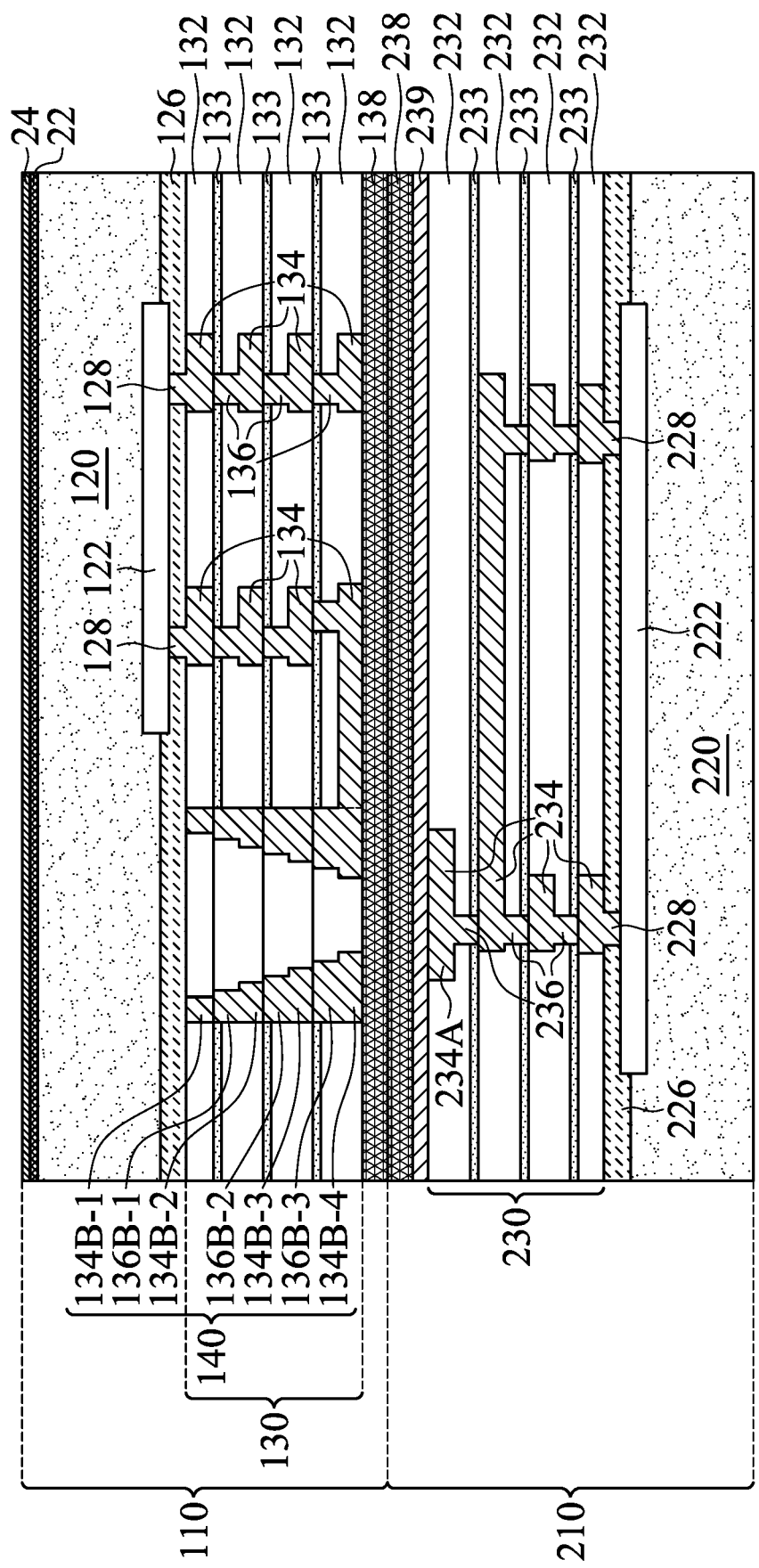

As shown in FIG. 3, semiconductor wafer 110 is bonded to semiconductor wafer 210. The respective process is illustrated as process 304 in the process flow shown in FIG. 15. Semiconductor wafer 110 and semiconductor wafer 210 are bonded together through suitable bonding techniques such as direct bonding, which may include oxide-to-oxide bonding (also referred to as fusion bonding), for example. In accordance with some embodiments of the present disclosure, in a direct bonding process, passivation layers 138 and 238 are oxide layers (for example, formed of silicon oxide), which are bonded to each other through fusion bonding, with Si—O—Si bonds formed, for example.

FIG. 3 further illustrates a cross-sectional view of the semiconductor device shown in FIG. 3 after one or more dielectric layer is formed on the stacked wafers. The respective process is illustrated as process 306 in the process flow shown in FIG. 15. In accordance with some embodiments of the present disclosure, the dielectric layers include pad oxide layer 22 and hard mask layer 24 over pad oxide layer 22. Pad oxide layer 22 may be formed of silicon oxide, and hard mask layer 24 may be formed of silicon nitride. The dielectric layer(s) may also act as a Bottom Anti-Reflection Coating (BARC) layer. Layers 22 may be formed using, for example, thermal oxidation, with a top surface layer of substrate 120 being oxidized. Layer 24 may be formed using a deposition method such as Chemical Vapor Deposition (CVD), Plasma Enhanced Chemical Vapor Deposition (PECVD), Atomic Layer Deposition (ALD), or the like. Layers 22 and 24 may also be formed of other dielectric materials.

Figure 4:
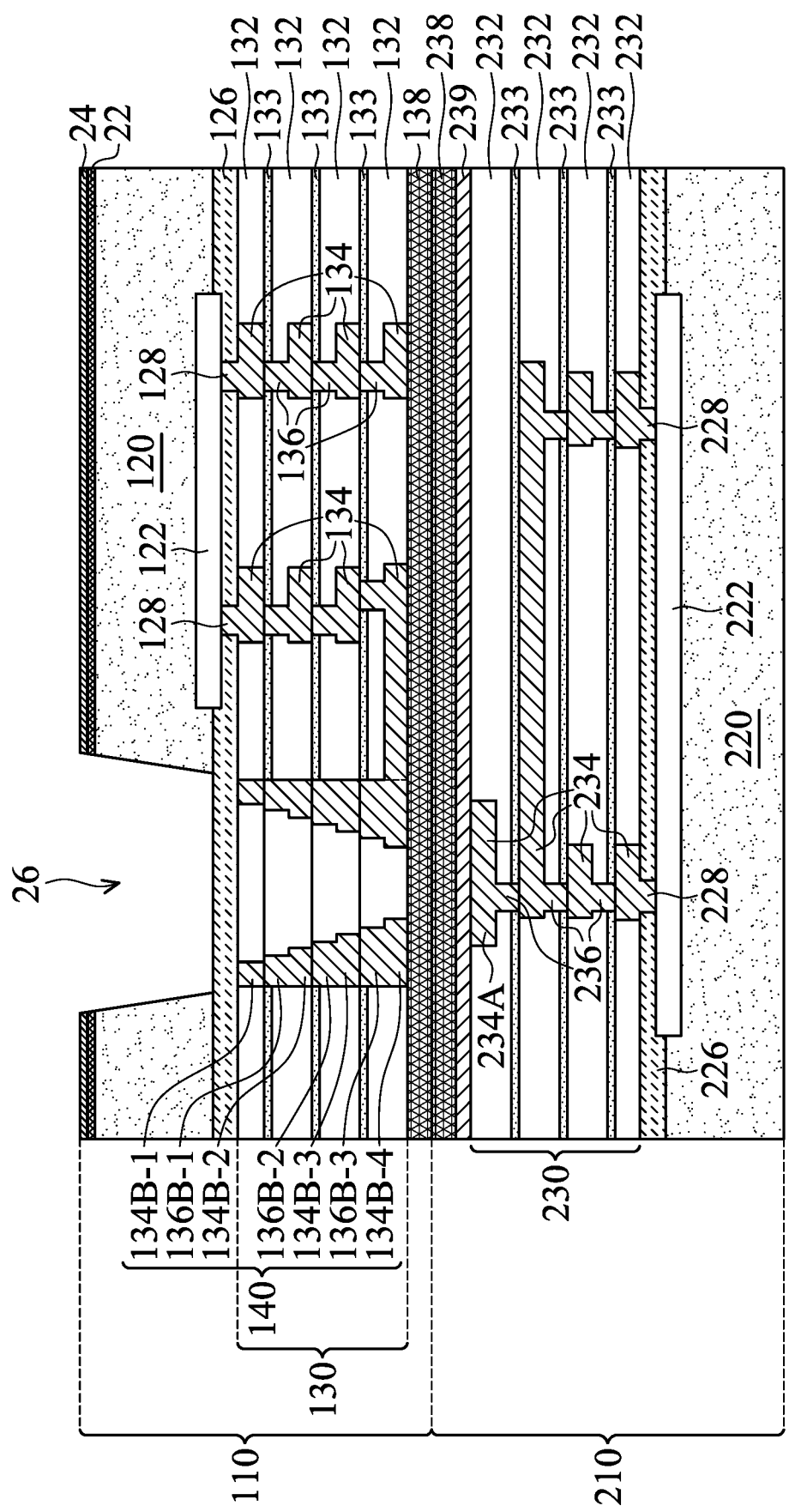

Next, a patterned mask such as a photo resist (not shown) is formed over dielectric layers 22 and 24 using suitable deposition and photolithography techniques. A suitable etching process, such as a Reactive Ion Etch (RIE) process or other dry etch process may be performed on substrate 120 of semiconductor wafer 110 and dielectric layers 22 and 24. As a result, as shown in FIG. 4, opening 26 is formed in dielectric layers 22 and 24 and substrate 120. The respective process is illustrated as process 308 in the process flow shown in FIG. 15. Opening 26 penetrates through semiconductor substrate 120, and stops on an underlying dielectric layer. For example, opening 26 may be stopped on the top surface of a Contact Etch Stop Layer (CESL, not shown), which is formed over ILD 126, with the top surface of the CESL exposed to opening 26. In accordance with alternative embodiments of the present disclosure, opening 26 penetrates through the CESL and stops on the top of ILD 126, with the top surface of ILD 126 exposed to opening 26. In accordance with alternative embodiments of the present disclosure, opening 26 may penetrate through ILD 126 and stop on a top surface of an underlying dielectric layer.

Figure 5:
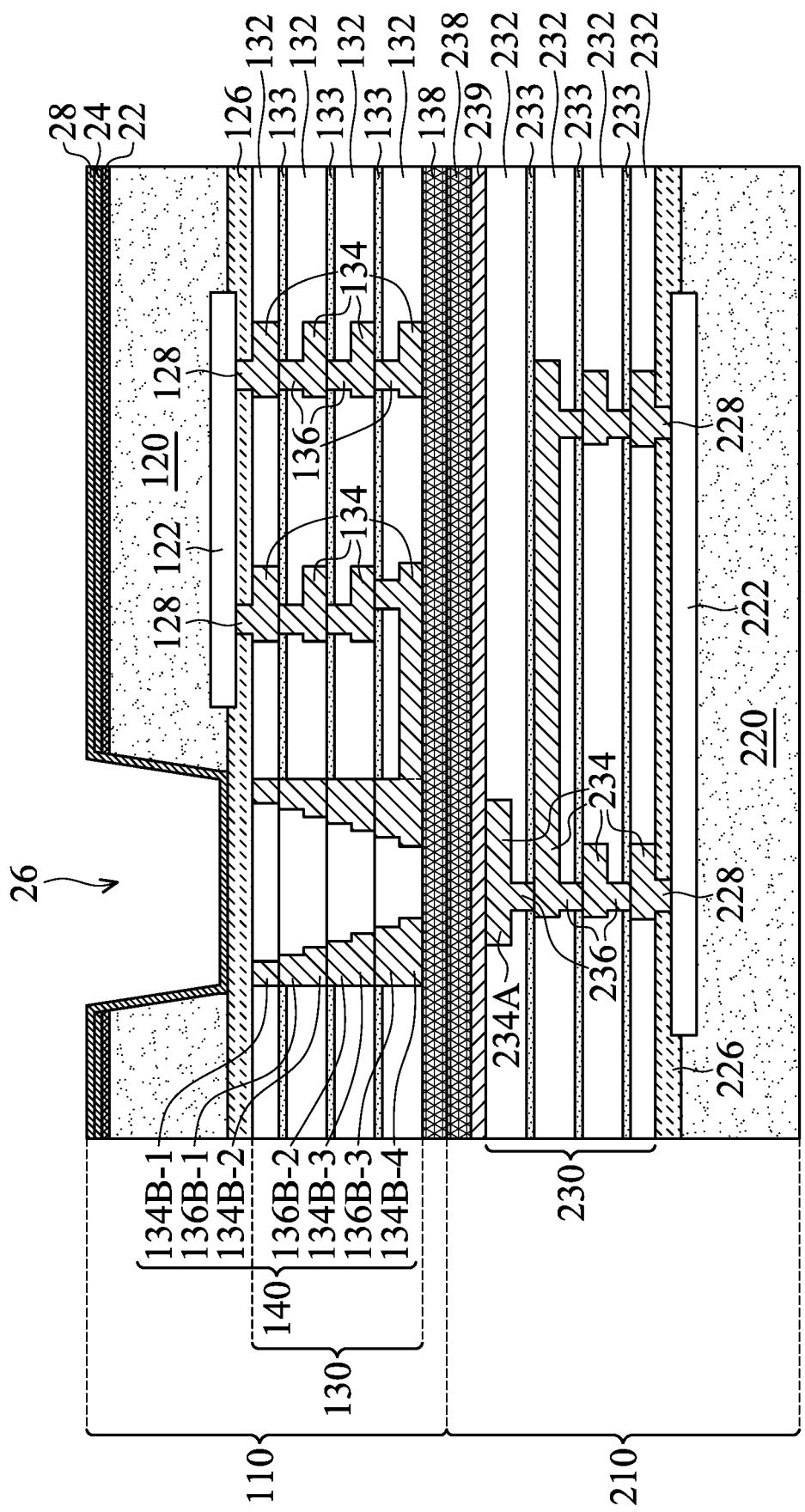

Referring to FIG. 5, dielectric layer 28 is deposited. The respective process is illustrated as process 310 in the process flow shown in FIG. 15. Dielectric layer 28 may be formed at the bottom and on the sidewalls of opening 26. In addition, dielectric layer 28 has a portion overlapping dielectric layers 22 and 24. Dielectric layer 28 may be formed of various dielectric materials that can be used in integrated circuit fabrication. For example, dielectric layer 28 may be formed of silicon dioxide, silicon nitride, silicon oxynitride, silicon carbide, or the like. In addition, a combination of the aforementioned dielectric materials may also be used to form dielectric layer 28. In accordance with some embodiments of the present disclosure, dielectric layer 28 is formed using a conformal deposition method such as CVD or ALD, and hence dielectric layer 28 is a conformal layer, for example, with different parts of dielectric layer 28 having thickness variation being smaller than about 20 percent.

Figure 6:
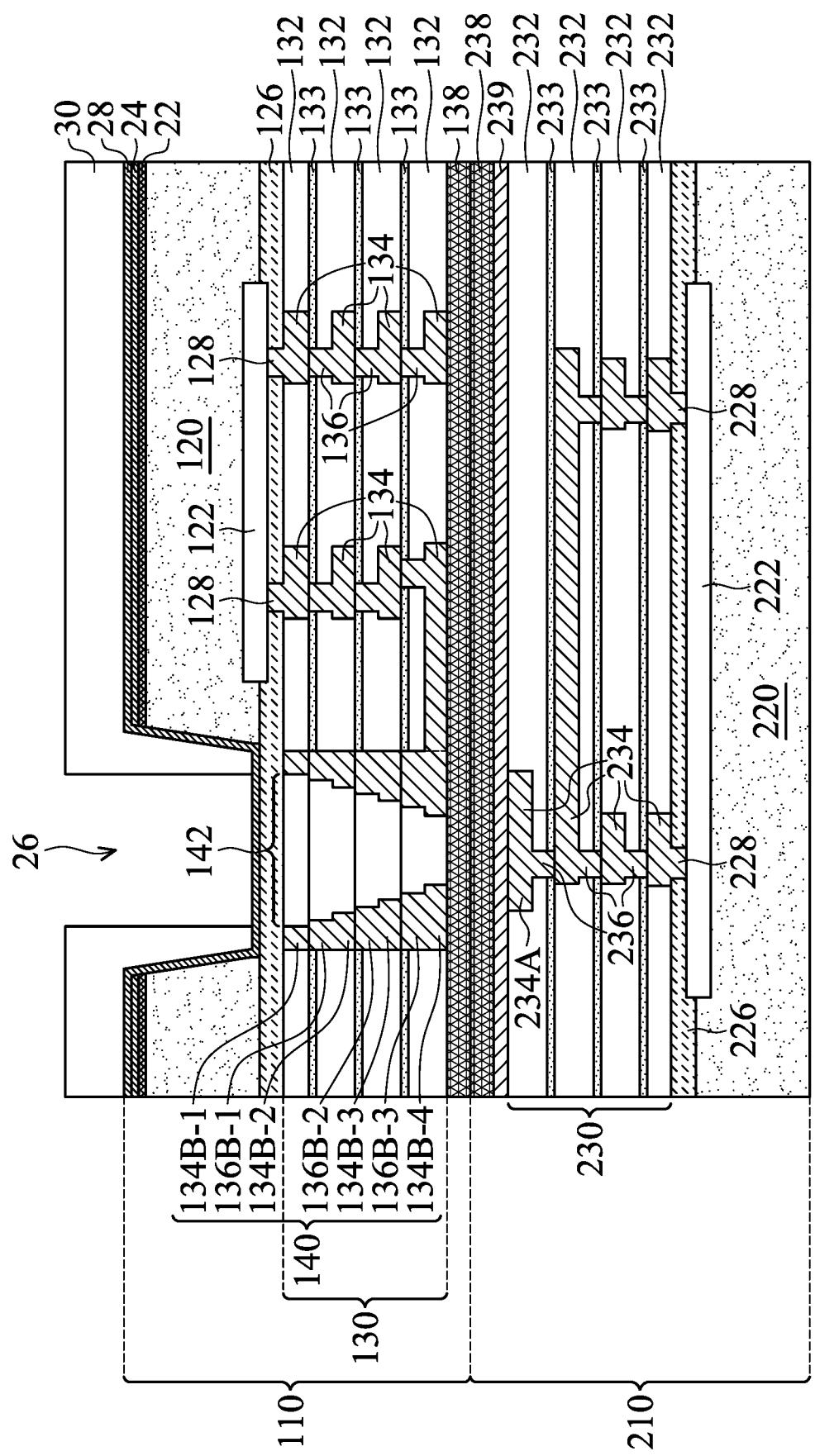

Referring to FIG. 6, patterned mask layer 30 is formed. Patterned mask 30 may extend into opening 26, so that the portions of dielectric layer 28 on the sidewalls of substrate 120 are protected. In accordance with some embodiments of the present disclosure, patterned mask 30 is a photo resist.

Figure 7:
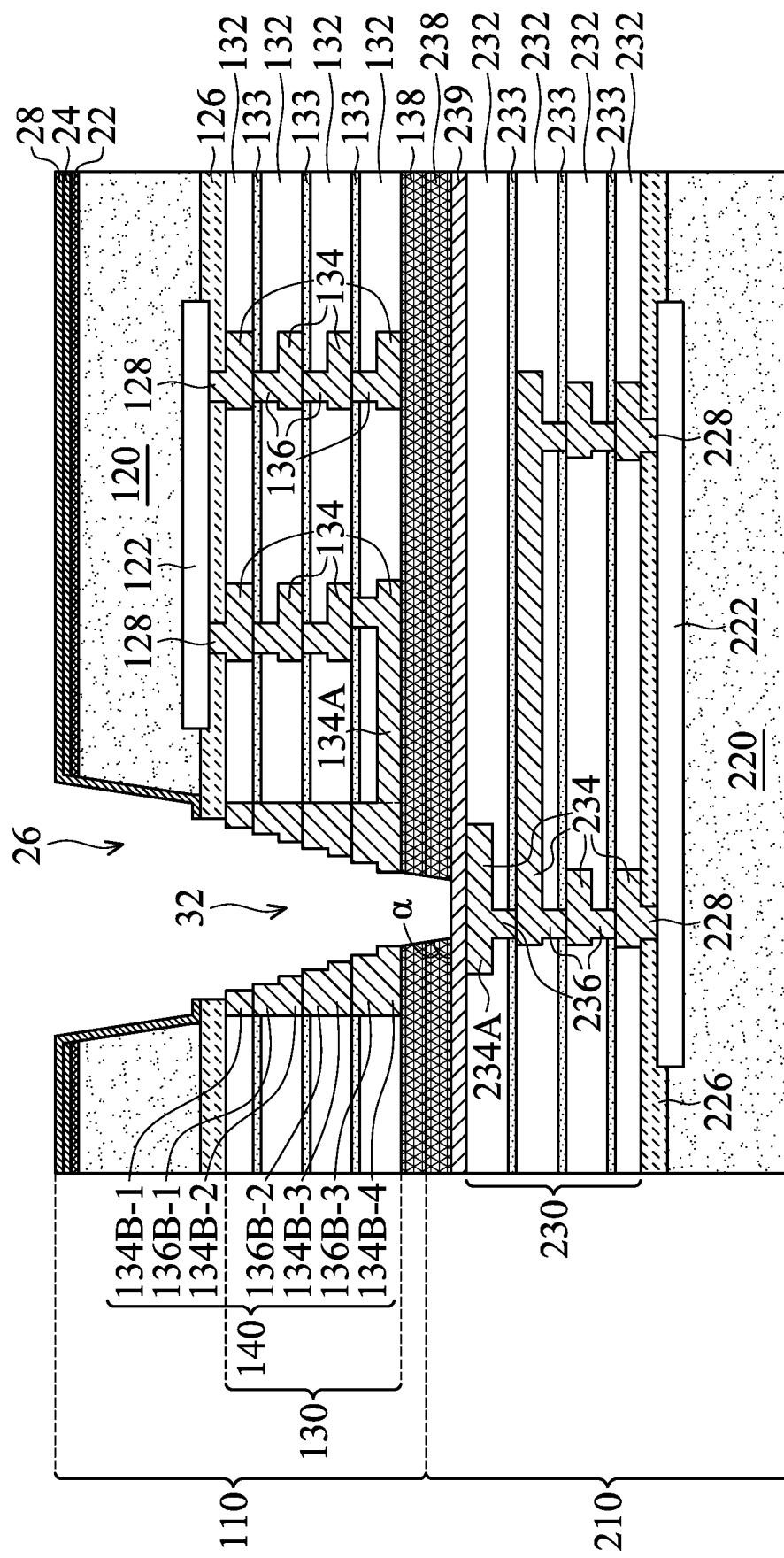

Referring to FIG. 7, patterned mask 30 is used as an etching mask to etch the underlying portions of wafers 110 and 210. The respective process is illustrated as process 312 in the process flow shown in FIG. 15. The etching is anisotropic, and may be performed using dry etching. Since the underlying etched structure includes different materials, the etching may also include a plurality of etching processes using different etching gases. As a result, opening 32 is formed as an extension of opening 26. With the proceeding of the etching process, the inner surfaces of metal pipe 140 are exposed. The etching gases are selected so that the exposed portions of metal pipe 140 are not etched, while dielectric region 142 (FIG. 6) is etched. For example, the etching gas may include a mixed gas of $NF_3$ and $NH_3$, or a mixed gas of HF and $NH_3$, depending on the material of the etched portions.

In the etching of dielectric region 142 as shown in FIG. 6, although metal pipe 140 is not intended to be etched, since the etching selectivity between the etching rates of dielectric region 142 and metal pipe 140 is not infinite, the corners of the exposed metal pipe 140 may be rounded. Overall, the inner sidewalls of metal pipe 140 facing opening 32 will have a slanted profile, with the inner sidewalls being slanted with a plurality of ripples. Accordingly, the sidewalls of each of the metal-line portions 134B-1, 134B-2, 134B-3, and 134B-4 and via portions 136B-1, 136B-2, and 136B-3 may have continuously slanted sidewalls from top to bottom.

After the removal of dielectric region 142, the underlying portions of passivation layers 138 and 238 are etched, and opening 32 extends to the top surface of etch stop layer 239. In accordance with some embodiments of the present disclosure, etch stop layer 239 is used to determine when the etching should be stopped. The determination is performed by detecting the presentation of the elements in etch stop layer 239, and the finding of the elements (such as nitrogen, if the overlying passivation layers 138 and 238 do not include nitride) in etch stop layer 239 indicates that etch stop layer 239 has been exposed. Upon the exposure of etch stop layer 239, the etching of the regions above etch stop layer 239 is stopped. By forming etch stop layer 239 in wafer 210, the process is better controlled, and no excess etching is needed. For example, the etching rates of the edge portions and center portions of wafers 110/210 are different. To ensure the etching is stopped after the exposure of all metal pads 234A in wafer 210, the etching time is prolonged. The prolonged etching causes damage to the exposed joint between passivation layers 138 and 238, and voids may be generated to extend into the interface. These voids cause difficulty in the subsequent filling of openings 26 and 32 with metal, and may cause voids in the resulting conductive plug. The formation of the etch stop layer 239 improves the process control, and results in the desirable reduction in the over-etching. As a comparison, wafer 110 may not include an etch stop layer between passivation layer 138 and the top metal 134A.

In accordance with some embodiments, the portion of opening 32 in passivation layers 138 and 238 are made steep. For example, when passivation layers 138 and 238 are formed of silicon oxide, in the etching of passivation layers 138 and 238, a fluorine-containing etching gas such as $CF_4$, $C_4F_8$, $CHF_3$, or the like, or combinations thereof may be used as the etching gas. Oxygen ($O_2$) may be added. The adoption of carbon-and-fluorine-containing etching gas results in the formation of polymer, which covers the sidewalls of the formed opening in passivation layers 138 and 238. The amount of the polymer affects how vertical the sidewall of the opening is, and with a proper thickness of the polymer, the opening in passivation layers 138 and 238 may be substantially vertical. The thickness of the polymer may be adjusted by adjusting the flow rate of oxygen, and with more oxygen provided, the polymer is thinner, and vice versa. In accordance with some embodiments of the present disclosure, the tilt angle α is greater than about 85 degrees, and may be in the range between about 85 degrees and about 90 degrees, or in the range between about 88 degrees and about 90 degrees.

Figure 8:
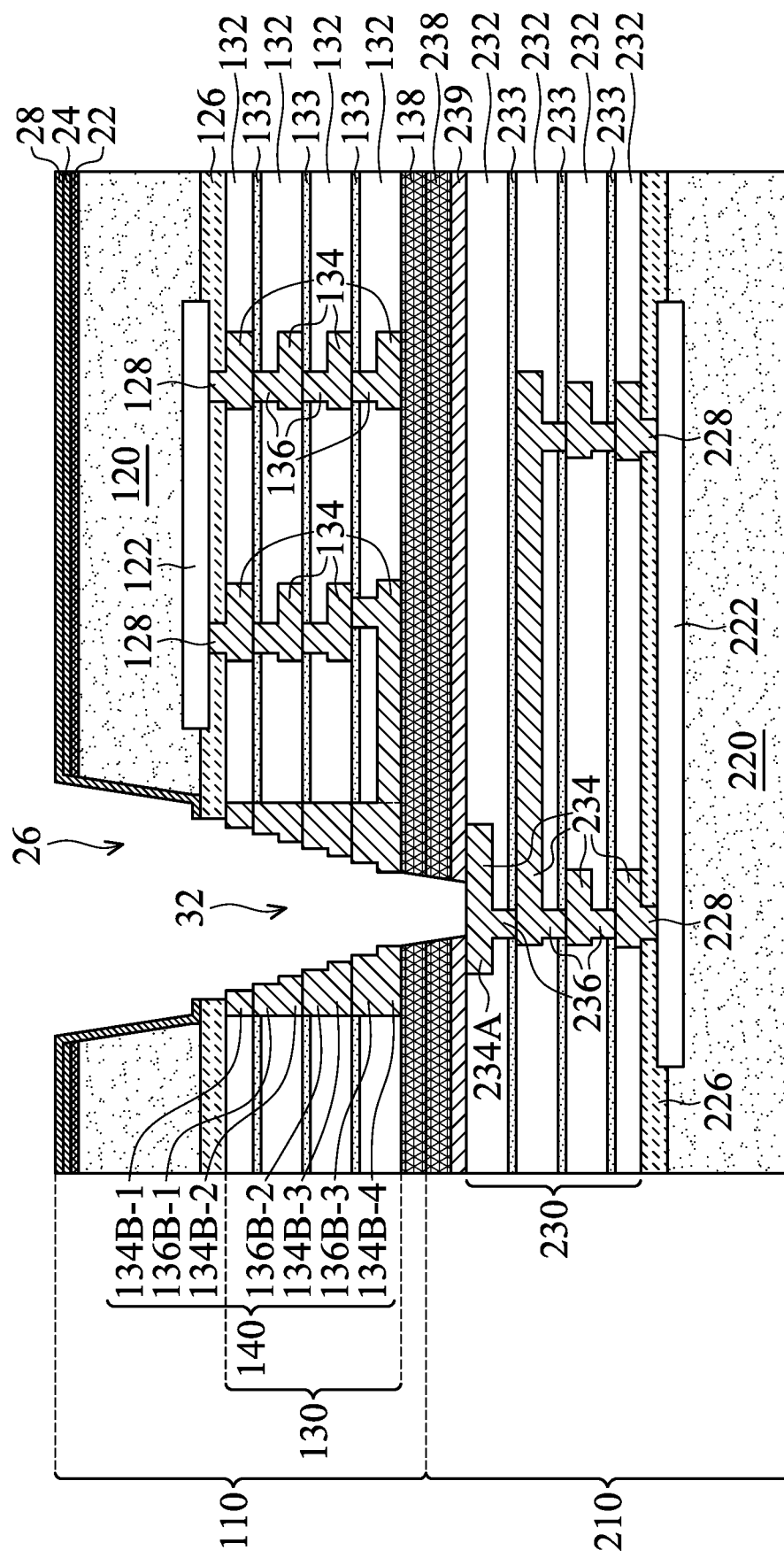

FIG. 8 illustrates the etching of etch stop layer 239, hence exposing metal pad 234A. The respective process is illustrated as process 314 in the process flow shown in FIG. 15. The process conditions for etching passivation layers 138 and 238 are different from the process conditions for etching etch stop layer 239. For example, the etching gas for etching passivation layers 138 and 238 may be different from the etching gas used for etching etch stop layer 239.

Figure 9:
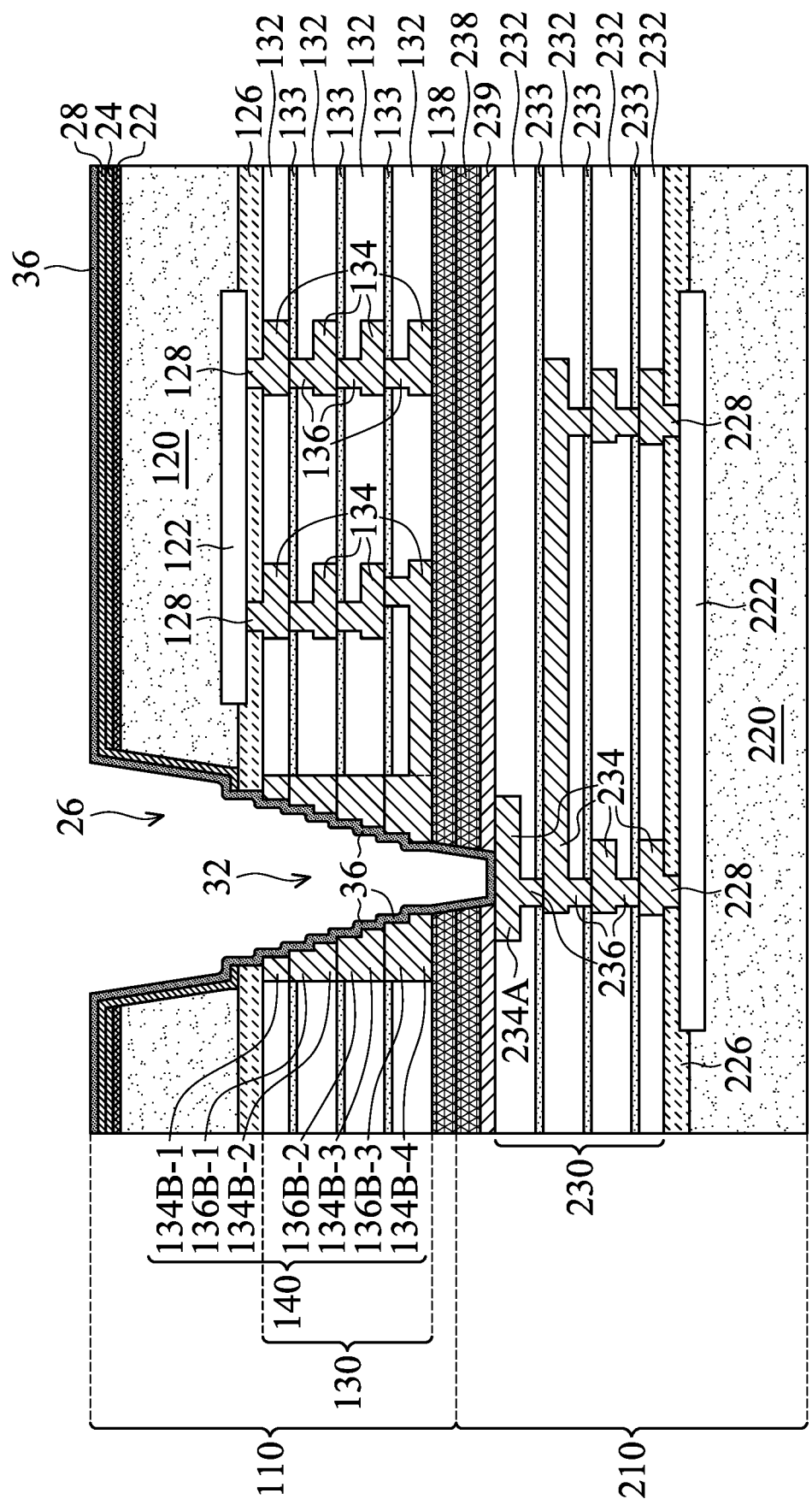

Next, referring to FIG. 9, protection layer 36 is formed. The respective process is illustrated as process 316 in the process flow shown in FIG. 15. Protection layer 36 extends to the bottom and the sidewalls of openings 26 and 32, and may extend on dielectric layer 28. Protection layer 36 is formed of a dielectric material, which may be selected from silicon dioxide, silicon nitride, silicon oxynitride, silicon carbide, or the like. In addition, a combination of the aforementioned dielectric materials may also be used to form protection layer 36. In accordance with some embodiments of the present disclosure, protection layer 36 is formed using a conformal deposition method such as ALD or CVD. Accordingly, the thickness of protection layer 36 is uniform or substantially uniform, for example, with different parts having thickness variations smaller than about 20 percent. The thickness of protection layer 36 may be in the range between about 30 Å and about 300 Å. Dielectric layer 28 and protection layer 36 may be formed of the same dielectric material, or different dielectric materials.

Figure 10:
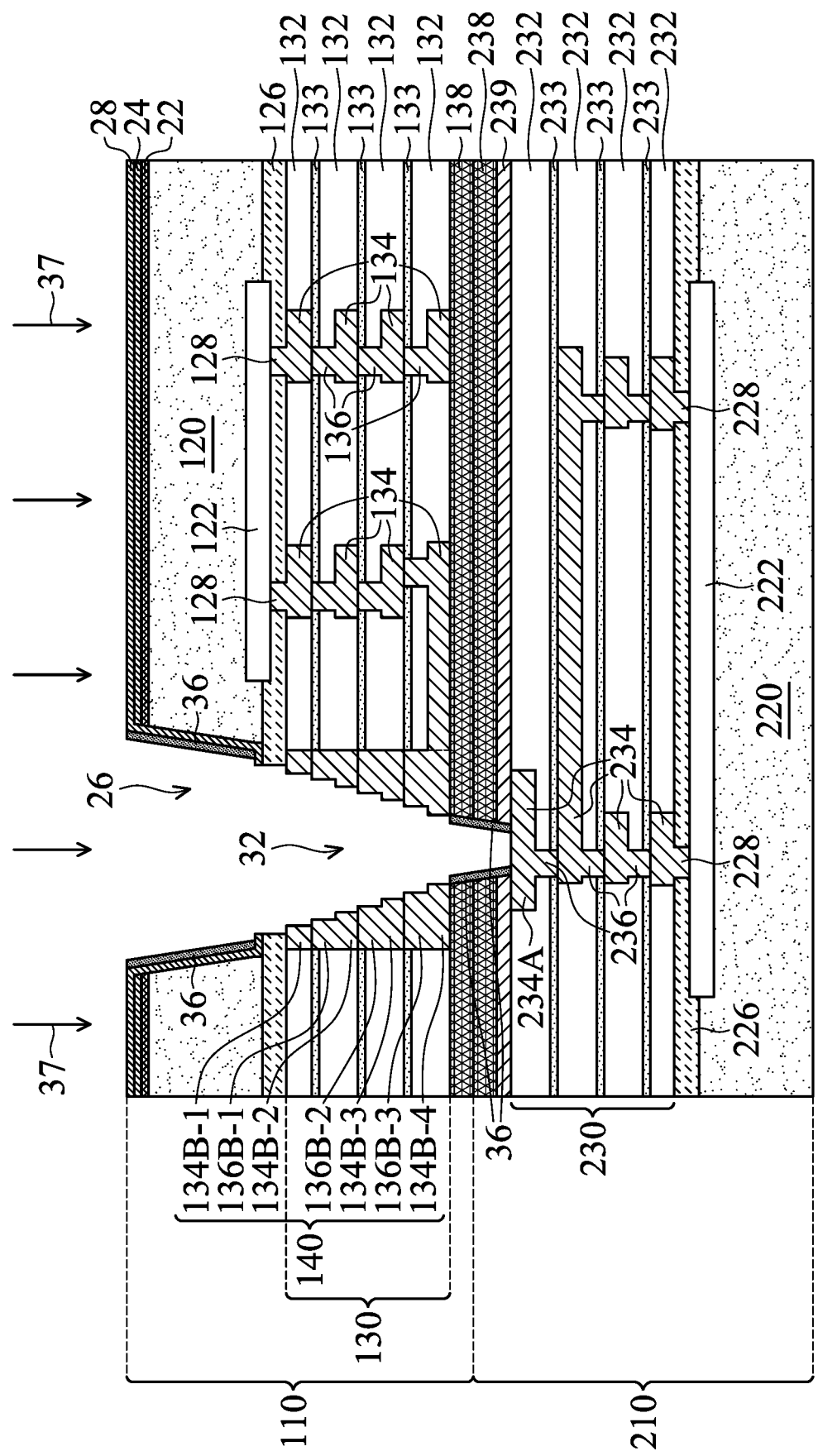

Referring to FIG. 10, an anisotropic etching is performed to etch protection layer 36, wherein the etching is shown by arrows 37. The anisotropic etching may be performed without forming an etching mask. Accordingly, an entirety of the opening as shown in FIG. 10 may be exposed to the etching. The respective process is illustrated as process 318 in the process flow shown in FIG. 15. The etching may include a dry etching process. In the etching, the horizontal portions of protection layer 36 are removed, and the horizontal portions include the portions on the top of dielectric layers 22 and 24, and the portion at the bottom of opening 32. Due to the formation of the steps of metal pipe 140, the inner sidewalls of metal pipe 140 overall have a slanted profile. Furthermore, the corners of the exposed metal pipe 140 are rounded and the inner sidewalls of metal pipe 140 may be slant. This makes the removal of some vertical portions of dielectric protection layer 36 easy. In accordance with some embodiments, there is no remaining portion of the protection layer 36 in contact with the sidewalls of metal pipe 140. Alternatively stated, the portions of dielectric protection layer 36 on the sidewalls of metal pipe 140 are removed. Also, there may not be any remaining portion of the protection layer 36 at the same level as metal pipe 140, such as at the corners of the steps.

Due to the vertical profile of the portion of opening 32 in passivation layers 138 and 238, and further because the portions of protection layer 36 on the sidewalls of passivation layers 138 and 238 are deep inside opening 32, the portions of protection layer 36 on the sidewalls of passivation layers 138 and 238 and etch stop layer 239 have at least some portions, and possibly majority portions, remaining. Protection layer 36 may have some portions left in opening 26 (at the same level as substrate 120), which portions may be thinned. The portion of protection layer 36 at the same level as substrate 120 may also be removed during the anisotropic etching. However, since dielectric layer 24 protects the sidewalls of substrate 120, the thickness of the remaining portion of protect layer 36 in opening 26 may be greater or smaller without affecting the performance of the resulting structure. Since substrate 120 and passivation layers 138 and 238 are thicker than each layer of the via portions and metal line portions of metal pipe 140, further because the sidewalls of passivation layers 138 and 238 are made to be substantially vertical, protection layer 36 may be removed from metal pipe 140, but may remain on the sidewalls of passivation layers 138 and 238. Protection layer 36 thus protects the interface between passivation layers 138 and 238, which is the bonded interface. Also, the interface may be damaged in the preceding formation of opening 32, causing voids extending into the interface. Protection layer 36 has the function of filling the voids at least partially. The remaining portions of protection layer 36 form two rings, one at the level of semiconductor substrate 120, and the other one at the level of passivation layers 138 and 238.

Figure 11:
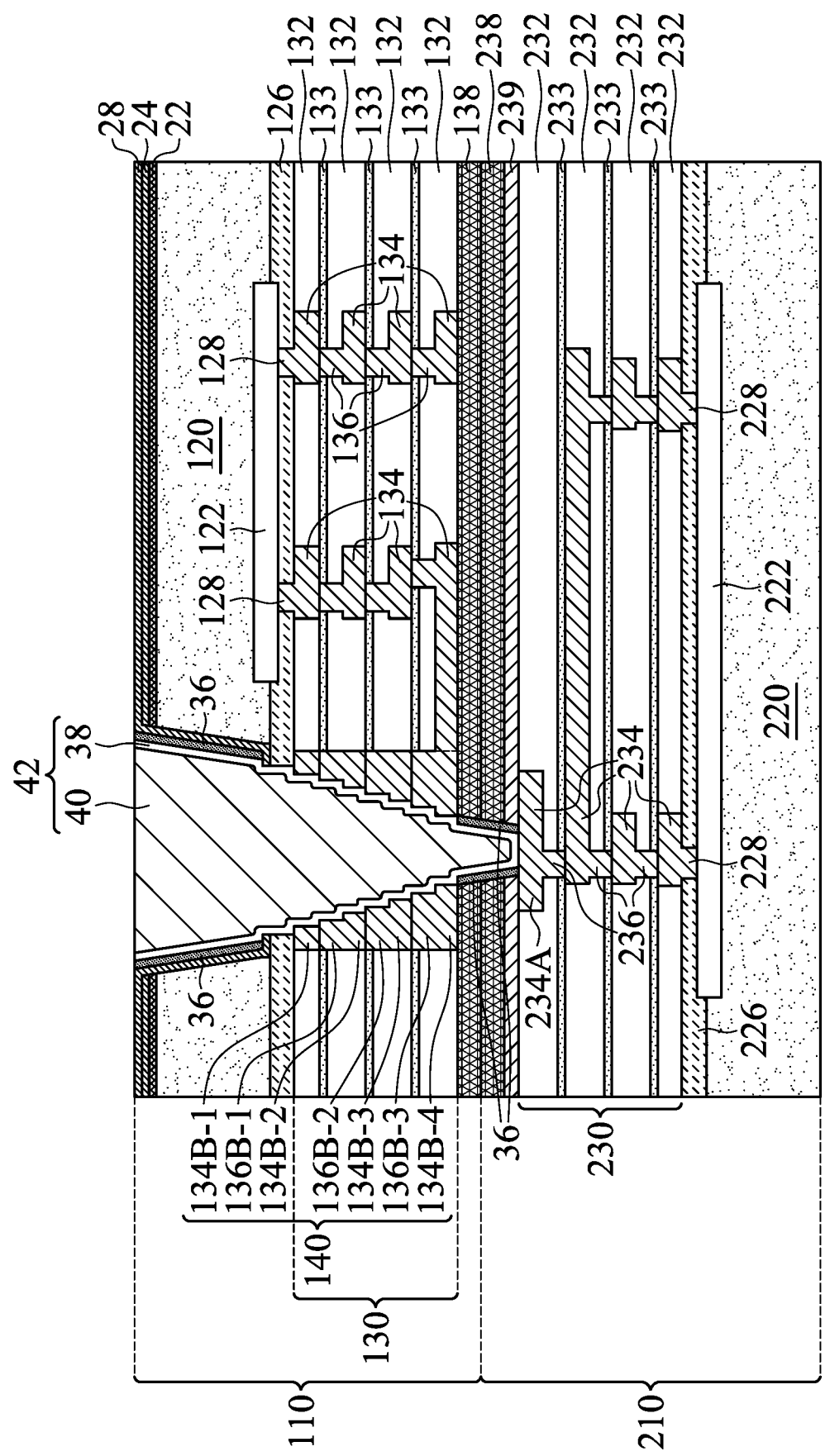

Conductive materials are then filled into openings 26 and 32 in accordance with some embodiments of the present disclosure. The resulting structure is shown in FIG. 11. In accordance with some embodiments of the present disclosure, conductive barrier layer 38 is deposited lining the sidewalls and the bottoms of openings 26 and 32. The formation of the protection layer 36 on the sidewalls of passivation layers 138 and 238 improves the adhesion of conductive barrier layer 38. The respective process is illustrated as process 320 in the process flow shown in FIG. 15. Conductive barrier layer 38 may be formed of titanium, titanium nitride, tantalum, tantalum nitride, combinations thereof, or composite layers thereof. In accordance with some embodiments of the present disclosure, conductive barrier layer 38 has a substantially uniform thickness. Conductive barrier layer 38 may be formed using a conformal deposition method such as ALD or CVD.

In addition, a seed layer (a part of conductive material 40, not shown separately) may be deposited over conductive barrier layer 38. The seed layer may be formed of copper or a copper alloy. The seed layer may be formed by a suitable deposition technique such as PVD. Once conductive barrier layer 38 and the seed layer have been deposited, conductive material 40 is filled into the remaining openings 26 and 32. The respective process is illustrated as process 322 in the process flow shown in FIG. 15. Conductive material 40 may also be formed of copper or a copper alloy. In accordance with some embodiments of the present disclosure, conductive material 40 is filled in the openings through an electro-plating process.

After the filling of conductive material, a planarization process such as a Chemical Mechanical Polish (CMP) process or a mechanical grinding process is performed to remove excess portions of conductive material 40 and conductive barrier layer 38. The respective process is illustrated as process 324 in the process flow shown in FIG. 15. The resulting structure is shown in FIG. 11. During the planarization, the horizontal portions of protection layer 36 may be used as a CMP stop layer. In accordance with some embodiments of the present disclosure, the horizontal portions of dielectric layer 24 or 22 may be used as the CMP stop layer, and the overlying portions of dielectric layers are removed. As shown in FIG. 11, conductive plug 42 is formed, and includes the remaining portions of conductive barrier layer 38 and conductive material 40. Conductive plug 42 is electrically connected to metal pipe 140, which is further connected to active devices 122 in wafer 110. Furthermore, conductive plug 42 is electrically connected to metal pad 234A, which is further connected to active devices 222 in wafer 210. Accordingly, conductive plug 42 acts as an interconnection for electrically coupling/connecting to active devices 122 and 222. It is appreciated that protection layer 36 includes a first portion in semiconductor substrate 120, and a second portion in passivation layers 138 and 238. Each of the first portion and the second portion of protection layer 36 forms a full ring encircling conductive plug 42.

Figure 12:
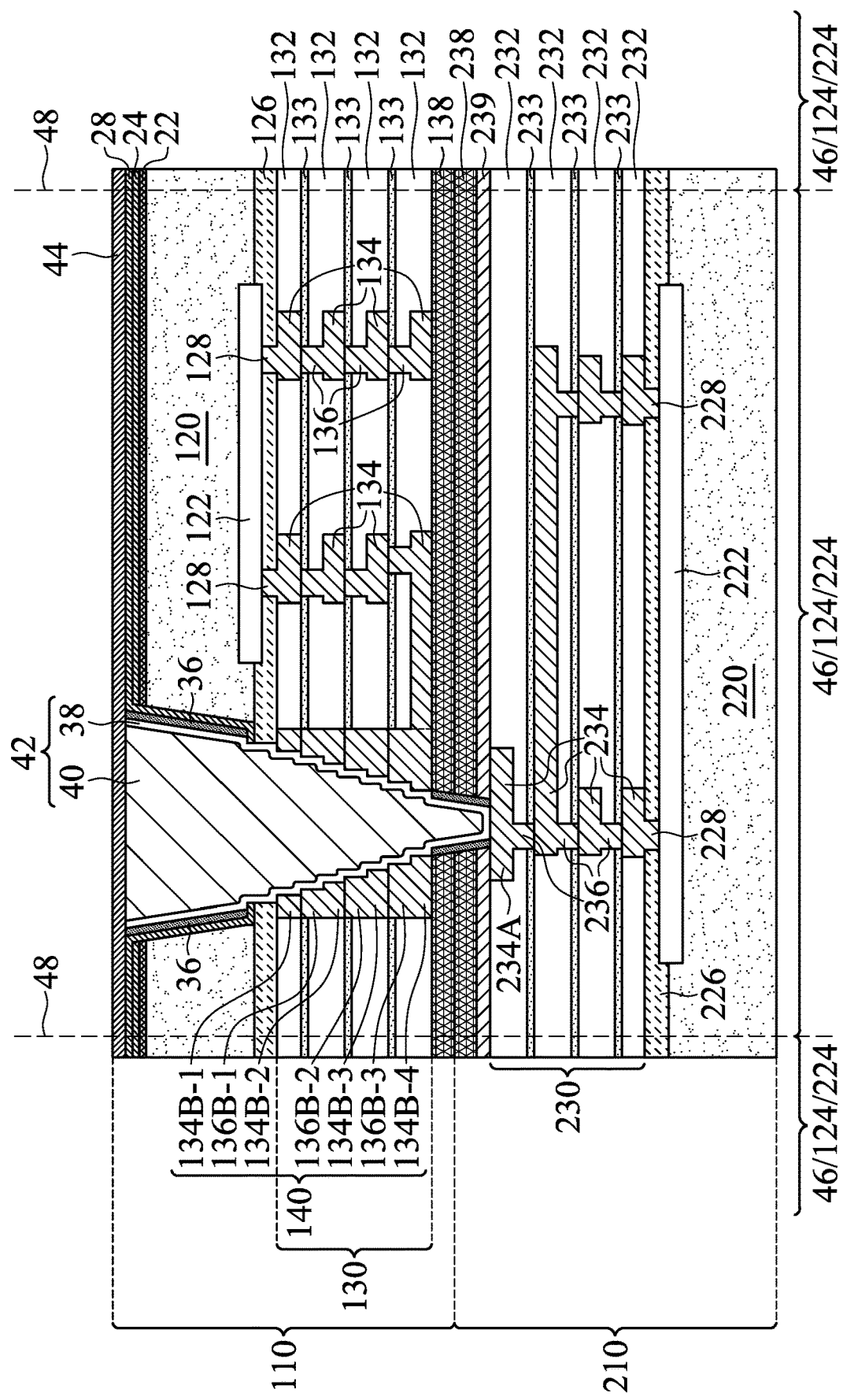

Referring to FIG. 12, dielectric layer 44 is formed. Dielectric layer 44 is formed of a dielectric material, which may be selected from silicon nitride, silicon oxynitride, silicon oxy-carbide, silicon carbide, combinations thereof, and multi-layers thereof. Dielectric layer 44 may be deposited through suitable deposition techniques such as a CVD method, ALD, PECVD, etc. In subsequent steps, the bonded wafers 110 and 210 are sawed into a plurality of packages 46 along scribe lines 48, with each of the packages including device die 124 and device die 224. In accordance with some embodiment in which device die 124 is a backside illumination image sensor, light may be projected from the top of device die 124 onto the image sensors in device die 124.

It should be noted that while FIG. 11 illustrates two semiconductor wafers stacked together, one skilled in the art will recognize that the stacked semiconductor device shown in FIG. 12 is merely an example. There may be many alternatives, variations, and modifications. For example, the stacked semiconductor device may accommodate more than two semiconductor wafers.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming the protection layer, the bonded interface between two wafers is protected, and the corresponding voids are filled. The subsequently formed conductive plug is less likely to have voids. Furthermore, the formation of the etch stop layer between the passivation layer and the top metal pad further reduces the damage to the interface.

In accordance with some embodiments of the present disclosure, a method includes bonding a first wafer to a second wafer. The first wafer includes a plurality of dielectric layers, a metal pipe penetrating through the plurality of dielectric layers, and a dielectric region encircled by the metal pipe. The dielectric region has a plurality of steps formed of sidewalls and top surfaces of portions of the plurality of dielectric layers that are encircled by the metal pipe. The method further includes etching the first wafer to remove the dielectric region and to leave an opening encircled by the metal pipe, extending the opening into the second wafer to reveal a metal pad in the second wafer, and filling the opening with a conductive material to form a conductive plug in the opening. In an embodiment, the method further comprises after the metal pad in the second wafer is revealed, depositing a dielectric protection layer extending into the opening; and performing an anisotropic etch to remove portions of the dielectric protection layer in the metal pipe. In an embodiment, after the anisotropic etch, the dielectric protection layer has a sidewall portion left to cover sidewalls of a first surface dielectric layer in the first wafer and a second surface dielectric layer in the second wafer, wherein the first surface dielectric layer is bonded to the second surface dielectric layer. In an embodiment, the method further comprises forming the metal pipe, wherein the dielectric region in the metal pipe has gradually reduced lateral dimensions from a top surface of the dielectric region to a bottom surface of the dielectric region. In an embodiment, the metal pipe comprises a plurality of metal line portions, each in one of the plurality of dielectric layers; and a plurality of via portions interpolated with the plurality of metal line portions, wherein the plurality of metal line portions and the plurality of via portions form a plurality of rings, and each of the plurality of rings has an inner lateral dimension equal to or greater than inner lateral dimensions of all respective lower rings. In an embodiment, each of the plurality of rings has a lateral dimension greater than inner lateral dimensions of all respective lower rings. In an embodiment, the second wafer comprises an etch stop layer over and contacting the metal pad, and the extending the opening into the second wafer comprises etching a dielectric layer over the etch stop layer, and the etching stops on the etch stop layer; and etching through the etch stop layer, wherein the dielectric layer and the etch stop layer are etched using different etching gases.

In accordance with some embodiments of the present disclosure, a method comprises forming a first wafer comprising forming a plurality of dielectric layers; and forming a metal pipe penetrating through the plurality of dielectric layers, with portions of the plurality of dielectric layers encircled by the metal pipe forming a dielectric region; forming a second wafer comprising forming a metal pad; and forming an etch stop layer over and contacting the metal pad; bonding the first wafer to the second wafer, wherein the metal pipe overlaps the metal pad; etching the first wafer and the second wafer to form an opening, wherein the dielectric region is removed in the etching to leave an opening, and the etching is stopped on a top surface of the etch stop layer; etching the etch stop layer; and forming a conductive plug in the opening. In an embodiment, the etching the first wafer and the second wafer comprises etching a dielectric layer over and contacting the etch stop layer using an etching gas different from an etching gas for etching the etch stop layer. In an embodiment, the forming the metal pipe comprises forming a plurality of metal-line portions and a plurality of via portions having different inner lateral dimensions. In an embodiment, the metal pipe comprises a first surface facing toward a semiconductor substrate in the first wafer; and a second surface facing away from the semiconductor substrate, and in a direction from the first surface to the second surface, the inner lateral dimensions of the metal pipe continuously reduce. In an embodiment, each of the plurality of metal-line portions has an inner lateral dimension different from inner lateral dimensions of immediate overlying and underlying metal via portions. In an embodiment, the etching the first wafer comprises etching-through a semiconductor substrate of the first wafer to form a through-opening; forming a dielectric liner lining the through-opening; and etching the dielectric liner and portions of the first wafer underlying a bottom portion of the dielectric liner. In and embodiment, the method further comprises, after the etching the etch stop layer and before the forming the conductive plug, forming a dielectric protection layer; and removing portions of the dielectric protection layer on inner sidewalls of the metal pipe, wherein the dielectric protection layer comprises an upper portion on a sidewall of a semiconductor substrate of the first wafer and a lower portion extending from the first wafer into the second wafer.

In accordance with some embodiments of the present disclosure, a structure comprises a first die comprising a first semiconductor substrate; a plurality of dielectric layers underlying the first semiconductor substrate; a plurality of metal rings, each in one of the plurality of dielectric layers, wherein inner lateral dimensions of the plurality of metal rings are different from each other, and wherein the plurality of metal rings are stacked to form a metal pipe; and a first surface dielectric layer underlying the plurality of metal rings and the plurality of dielectric layers; a second die comprising a second semiconductor substrate; a metal pad over the second semiconductor substrate; a second surface dielectric layer overlying the metal pad, wherein the first surface dielectric layer is bonded to the second surface dielectric layer; and a conductive plug penetrating through the first die to contact a top surface of the metal pad. In and embodiment, the structure further comprises a dielectric protection layer comprising a first portion encircling the conductive plug, wherein the first portion of the dielectric protection layer contacts sidewalls of the first surface dielectric layer and the second surface dielectric layer. In and embodiment, the dielectric protection layer further comprises a second portion encircling the conductive plug, wherein the second portion of the dielectric protection layer contacts sidewalls of the first semiconductor substrate. In and embodiment, the conductive plug has a portion in the metal pipe, and from a top to a bottom of the portion of the conductive plug, the, inner lateral diameters of the portion of the conductive plug gradually decrease. In and embodiment, the plurality of metal rings comprise a plurality of damascene structures, with each having a metal-line portion and a via portion overlying the metal-line portion, and the via portion has a first inner lateral dimension smaller than a second inner lateral dimension of the metal-line portion. In and embodiment, the structure further comprises an etch stop layer over and contacting the metal pad, with the conductive plug penetrating through the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    bonding a first wafer to a second wafer, wherein the first wafer comprises:
        a plurality of dielectric layers;
        a metal pipe penetrating through the plurality of dielectric layers; and
        a dielectric region encircled by the metal pipe, wherein the dielectric region has a plurality of steps, and the plurality of steps are formed of sidewalls and top surfaces of portions of the plurality of dielectric layers encircled by the metal pipe;
    etching the first wafer to remove the dielectric region and to leave an opening encircled by the metal pipe;
    extending the opening into the second wafer to reveal a metal pad in the second wafer;
    after the metal pad in the second wafer is revealed, depositing a dielectric protection layer extending into the opening;
    performing an anisotropic etch to remove portions of the dielectric protection layer in the metal pipe; and
    filling the opening with a conductive material to form a conductive plug in the opening.

2. The method of claim 1, wherein after the anisotropic etch, the dielectric protection layer has a sidewall portion left to cover sidewalls of a first surface dielectric layer in the first wafer and a second surface dielectric layer in the second wafer, wherein the first surface dielectric layer is bonded to the second surface dielectric layer.

3. The method of claim 1 further comprising forming the metal pipe, wherein the dielectric region in the metal pipe has gradually reduced lateral dimensions from a top surface of the dielectric region to a bottom surface of the dielectric region.

4. The method of claim 3, wherein the metal pipe comprises:
    a plurality of metal line portions, each in one of the plurality of dielectric layers; and
    a plurality of via portions interpolated with the plurality of metal line portions, wherein the plurality of metal line portions and the plurality of via portions form a plurality of rings, and each of the plurality of rings has an inner lateral dimension equal to or greater than inner lateral dimensions of all respective lower rings.

5. The method of claim 4, wherein each of the plurality of rings has a lateral dimension greater than inner lateral dimensions of all respective lower rings.

6. The method of claim 1, wherein the second wafer comprises an etch stop layer over and contacting the metal pad, and the extending the opening into the second wafer comprises:
    etching a dielectric layer over the etch stop layer, and the etching stops on the etch stop layer; and
    etching through the etch stop layer, wherein the dielectric layer and the etch stop layer are etched using different etching gases.

7. A method comprising:
    forming a first wafer comprising:
        forming a plurality of dielectric layers; and
        forming a metal pipe penetrating through the plurality of dielectric layers, with portions of the plurality of dielectric layers encircled by the metal pipe forming a dielectric region;
    forming a second wafer comprising:
        forming a metal pad; and
        forming an etch stop layer over and contacting the metal pad;
    bonding the first wafer to the second wafer, wherein the metal pipe overlaps the metal pad;
    etching the first wafer and the second wafer to form an opening, wherein the dielectric region is removed in the etching, and the etching is stopped on a top surface of the etch stop layer;
    etching the etch stop layer; and
    forming a conductive plug in the opening.

8. The method of claim 7, wherein the etching the first wafer and the second wafer comprises etching a dielectric layer over and contacting the etch stop layer using an etching gas different from an etching gas for etching the etch stop layer.

9. The method of claim 7, wherein the forming the metal pipe comprises forming a plurality of metal-line portions and a plurality of via portions having different inner lateral dimensions.

10. The method of claim 9, wherein the metal pipe comprises:
    a first surface facing toward a semiconductor substrate in the first wafer; and
    a second surface facing away from the semiconductor substrate, and in a direction from the first surface to the second surface, the inner lateral dimensions of the metal pipe continuously reduce.

11. The method of claim 10, wherein each of the plurality of metal-line portions has an inner lateral dimension different from inner lateral dimensions of immediate overlying and underlying metal via portions.

12. The method of claim 7, wherein the etching the first wafer comprises:
    etching-through a semiconductor substrate of the first wafer to form a through-opening;
    forming a dielectric liner lining the through-opening; and
    etching the dielectric liner and portions of the first wafer underlying a bottom portion of the dielectric liner.

13. The method of claim 7 further comprising:
after the etching the etch stop layer and before the forming the conductive plug, forming a dielectric protection layer; and
removing portions of the dielectric protection layer on inner sidewalls of the metal pipe, wherein the dielectric protection layer comprises an upper portion on a sidewall of a semiconductor substrate of the first wafer and a lower portion extending from the first wafer into the second wafer.

14. A method comprising:
etching a semiconductor substrate of a first wafer to form a first opening in the semiconductor substrate;
forming a patterned mask, wherein the patterned mask extends into the semiconductor substrate;
etching a dielectric layer underlying the semiconductor substrate, wherein the patterned mask is used as an etching mask;
etching dielectric regions underlying the dielectric layer to extend the opening into a region encircled by a metal pipe, wherein the metal pipe comprises a plurality of metal-line portions, and a plurality of via portions connecting respective overlying ones of the plurality of metal-line portions to respective underlying ones of the plurality of metal-line portions;
extending the opening into a second wafer underlying the first wafer to reveal a conductive feature in the second wafer; and
filling the opening with a conductive material to form a conductive plug.

15. The method of claim 14, wherein the dielectric regions and the metal pipe extend into a plurality of dielectric layers in the first wafer.

16. The method of claim 14, wherein upper portions of the metal pipe are narrower than respective lower portions of the metal pipe.

17. The method of claim 16, wherein the metal pipe comprises a plurality of pipe portions, each in one of a plurality of dielectric layers, and the plurality of pipe portions have outer edges flushed with each other, and inner edges offset from each other.

18. The method of claim 14 further comprising:
after the conductive feature in the second wafer is revealed, depositing a dielectric protection layer extending into the opening; and
performing an anisotropic etch to remove portions of the dielectric protection layer in the metal pipe.

19. The method of claim 14, wherein first outer edges of the plurality of metal-line portions are flush with, and are connected, to second outer edges of the plurality of via portions to form a continuous outer edge.

* * * * *